(12) United States Patent
Zhao

(10) Patent No.: US 9,740,559 B2
(45) Date of Patent: Aug. 22, 2017

(54) SYSTEMS AND METHODS FOR COMPACTION BASED FLASH MEMORY DATA RECOVERY

(71) Applicant: Avago Technologies General IP (Singapore) Pte. Ltd., Singapore (SG)

(72) Inventor: Zhijun Zhao, Fremont, CA (US)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 111 days.

(21) Appl. No.: 14/925,726

(22) Filed: Oct. 28, 2015

(65) Prior Publication Data

US 2017/0123900 A1    May 4, 2017

(51) Int. Cl.
G06F 11/10 (2006.01)
G11C 29/52 (2006.01)
H03M 13/11 (2006.01)

(52) U.S. Cl.
CPC .......... G06F 11/1068 (2013.01); G11C 29/52 (2013.01); H03M 13/1102 (2013.01); H03M 13/1111 (2013.01); G06F 2212/401 (2013.01); G06F 2212/403 (2013.01)

(58) Field of Classification Search
CPC .......... H03M 13/1111; G06F 2212/401; G06F 11/1068

See application file for complete search history.

(56) References Cited

U.S. PATENT DOCUMENTS

| | | | |
|---|---|---|---|
| 8,065,583 B2 | 11/2011 | Radke | |
| 8,947,929 B1* | 2/2015 | Yang | G11C 7/10 365/185.03 |
| 9,214,965 B2* | 12/2015 | Fitzpatrick | G06F 11/1012 |
| 9,286,155 B1* | 3/2016 | Low | G06F 11/1008 |
| 9,450,610 B1* | 9/2016 | Micheloni | H03M 13/1125 |
| 2008/0288849 A1* | 11/2008 | Park | H04L 25/067 714/780 |
| 2009/0248952 A1* | 10/2009 | Radke | G11C 11/5628 711/100 |
| 2011/0167305 A1* | 7/2011 | Haratsch | G11C 7/02 714/42 |
| 2011/0246855 A1* | 10/2011 | Cheng | G06F 11/1068 714/759 |
| 2012/0079351 A1* | 3/2012 | Cideciyan | G06F 11/1048 714/764 |
| 2013/0073798 A1 | 3/2013 | Kang et al. | |
| 2016/0218740 A1* | 7/2016 | Parthasarathy | G11C 11/5628 |
| 2017/0046220 A1* | 2/2017 | Sharon | G06F 3/0619 |

* cited by examiner

Primary Examiner — Steve Nguyen

(74) Attorney, Agent, or Firm — Sheridan Ross P.C.

(57) ABSTRACT

Embodiments are related to systems and methods for data storage, and more particularly to systems and methods for storing data to and accessing data from a flash memory.

20 Claims, 9 Drawing Sheets

SYSTEMS AND METHODS FOR COMPACTION BASED FLASH MEMORY DATA RECOVERY

FIELD OF THE INVENTION

Embodiments are related to systems and methods for data storage, and more particularly to systems and methods for storing data to and accessing data from a flash memory.

BACKGROUND

To increase density in a flash memory device, multi-level cells are used. Such multi-level cells may be, for example, programmed to with one of four voltage levels with each of the four voltage levels representing a two bit binary value. When reading such a multi-level cell, a read back voltage is compared with a center voltage threshold to determine the least significant bit of the two bit binary value and additional comparisons are performed with an upper voltage threshold and a lower voltage threshold to determine the most significant bit of the two bit binary value. Use of multiple comparisons to yield the two bit binary value results in considerable latency.

Hence, for at least the aforementioned reasons, there exists a need in the art for advanced systems and methods for storing and accessing data to/from a flash memory.

SUMMARY

Embodiments are related to systems and methods for data storage, and more particularly to systems and methods for storing data to and accessing data from a flash memory.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment or one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1A:
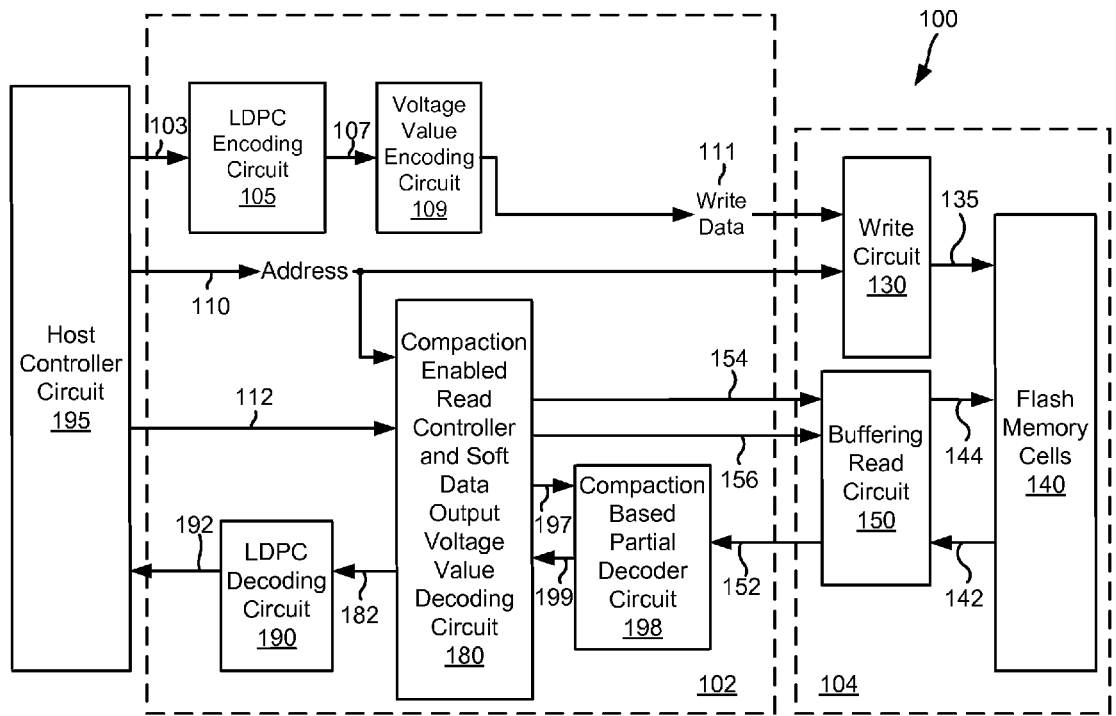
FIG. 1a shows a solid state storage system including a compaction based partial decoder circuit implemented on a semiconductor die apart from flash memory cells in accordance with some embodiments of the present invention.

Embodiments are related to systems and methods for data storage, and more particularly to systems and methods for storing data to and accessing data from a flash memory.

Various embodiments of the present invention provide systems for accessing a flash memory device. The systems include a data read circuit, a compaction based partial decoder circuit, and a first data decoding circuit. The data read circuit is operable to compare voltages read from a set of M groups of N flash memory cells with a first threshold value to yield a binary output set. The binary output set includes a set of M groups of N binary values where M and N are integers. The compaction based partial decoder circuit is operable to compact a subset of the M groups of N binary values to yield a compacted output. The compacted output is represented in fewer bits than required to represent the subset of the M groups of N binary values. The first data decoding circuit is operable to generate at least one soft data value based upon the compacted output. The soft data value corresponds to an element of a given codeword represented by the M groups of N binary values. In some cases, the systems are implemented in one or more semiconductor devices.

In some instances of the aforementioned embodiments where subset of the M groups of N binary values is a first subset of the M groups of N binary values and the compacted output is a first compacted output, the compaction based partial decoder circuit is further operable to repeatedly compact additional subsets of the M groups of N binary values to yield additional compacted outputs. The first decoder circuit is further operable to generate at least one additional soft data value based upon each of the respective additional compacted outputs. In some such instances, the system further includes a second data decoding circuit operable to apply a data decoding algorithm to the given codeword to yield a decoded output. The given codeword may be a low density parity check codeword, and the second data decoding circuit may be a low density parity check decoding circuit.

In particular instances of the aforementioned embodiments, N is three, the subset of the M groups of N binary values is one group of the N binary values, and the compacted output is a two bit ternary number. In various instances of the aforementioned embodiments, N is three, the subset of the M groups of N binary values is three groups of the N binary values, and the compacted output is a five bit ternary number. In yet other instances of the aforementioned embodiments, N is three, the subset of the M groups of N binary values is five groups of the N binary values, and the compacted output is an eight bit ternary number.

In various instances of the aforementioned embodiments, the given codeword is a first codeword, the at least one soft data value is a first soft data value, the binary output set is a first binary output set; the data read circuit is further operable to compare voltages read from the set of M groups of N flash memory cells with a second threshold value to yield a second binary output set; and the first data decoding circuit is further operable to: generate at least a second soft data value directly from the second binary output set, where the second soft data value corresponds to an element of a second codeword represented by the M groups of N binary values. In some such instances, the first data decoding circuit includes: a first look-up table including soft data values corresponding to respective values of the compacted output; and a second look-up table including soft data values corresponding to respective values of the N binary values.

In some instances of the aforementioned embodiments, the set of M groups of N binary values is a first set of M groups of N binary values, the given codeword is a first codeword, the at least one soft data value is a first soft data value, the binary output set is a first binary output set; the data read circuit is further operable to compare voltages read from the set of M groups of N flash memory cells with a second threshold value to yield a second binary output set, and the compaction based partial decoder circuit is further operable to compact a subset of a second set of M groups of N binary values to yield a second compacted output, where the second compacted output is represented in fewer bits than required to represent the subset of the second set of M groups of N binary values. The first data decoding circuit is further operable to generate at least a second soft data value directly from the second binary output set, where the second soft data value corresponds to an element of a second codeword represented by the M groups of N binary values. In some such instances, the first data decoding circuit includes: a first look-up table including soft data values corresponding to respective values of the first compacted output; and a second look-up table including soft data values corresponding to respective values of the first compacted output.

Other embodiments provide methods for accessing data from a flash memory device. The methods include: accessing a set of M groups of N flash memory cells to yield M groups of N voltages, and wherein M and N are integers; using a read circuit to compare the M groups of N voltages with a first threshold value to yield a binary output set, wherein the binary output set includes a set of M groups of N binary values; compacting a subset of the M groups of N binary values to yield a compacted output, wherein the compacted output is represented in fewer bits than required to represent the subset of the M groups of N binary values; and generating at least one soft data value based upon the compacted output, wherein the soft data value corresponds to an element of a given codeword represented by the M groups of N binary values.

In particular instances of the aforementioned embodiments, N is three, the subset of the M groups of N binary values is one group of the N binary values, and the compacted output is a two bit ternary number. In various instances of the aforementioned embodiments, N is three, the subset of the M groups of N binary values is three groups of the N binary values, and the compacted output is a five bit ternary number. In yet other instances of the aforementioned embodiments, N is three, the subset of the M groups of N binary values is five groups of the N binary values, and the compacted output is an eight bit ternary number.

In particular instances of the aforementioned embodiments, the subset of the M groups of N binary values is a first subset of the M groups of N binary values, and the compacted output is a first compacted output. In such instances, the methods further include: repeatedly compacting additional subsets of the M groups of N binary values to yield corresponding additional compacted outputs; generating at least one additional soft data value based upon each of the respective additional compacted outputs; and applying a data decoding algorithm to the given codeword to yield a decoded output.

Turning to FIG. 1a, a solid state storage system 100 is shown that includes a compaction based partial decoder circuit 198 implemented on a semiconductor die 102 apart from a semiconductor die 104 where flash memory cells 140 are implemented in accordance with some embodiments of the present invention. Solid state storage system 100 includes a host controller circuit 195, a low density parity check encoding circuit 105, a voltage value encoding circuit 109, a write circuit 130, flash memory cells 140, a buffering read circuit 150, a compaction enabled read controller and soft data output voltage value decoding circuit 180, and a low density parity check decoding circuit 190. Host controller circuit 195 directs read and write access to flash memory cells 140. Flash memory cells 140 may be NAND flash memory cells or another type of solid state memory cells as are known in the art.

Solid state storage system 100 is implemented using at least two distinct semiconductor dies. Semiconductor die 102 includes low density parity check encoding circuit 105, voltage value encoding circuit 109, compaction based partial decoder circuit 198, compaction enabled read controller and soft data output voltage value decoding circuit 180, and low density parity check decoding circuit 190. Semiconductor die 104 includes write circuit 130, flash memory cells 140, and buffering read circuit 150. It should be noted that while solid state storage system 100 is shown as distributed across two or more semiconductor dies, that other embodiments of the present invention may be implemented with a semiconductor die that includes all of low density parity check encoding circuit 105, voltage value encoding circuit 109, write circuit 130, flash memory cells 140, buffering read circuit 150, compaction enabled read controller and soft data output voltage value decoding circuit 180, and low density parity check decoding circuit 190.

A data write is effectuated when host controller circuit 195 provides input data 103 to low density parity check encoding circuit 105. Low density parity check encoding circuit 105 applies a low density parity check encoding algorithm to input data 103 to yield LDPC codewords 107. LDPC codewords 107 are provided to voltage value encoding circuit 109. Voltage value encoding circuit 109 applies multi-level cell encoding to a group of LDPC codewords 107 to yield write data 111. In some embodiments of the present invention, five LDPC codewords are encoded together to yield write data 111 that is directed to flash memory cells 140 that are written as two-bit cells. It should be noted that while the various embodiments are discussed in relation to using a low density parity check encoding/decoding algorithm, that other encoding/decoding algorithms known in the art may be used in accordance with other embodiments of the present invention.

Figure 2:
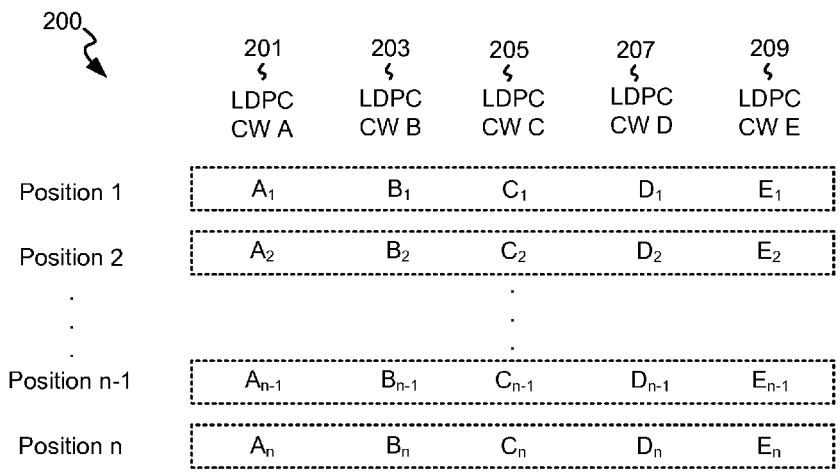
FIG. 2 shows an example of multi-level cell encoding using multiple low density parity check codewords in accordance with some embodiments of the present invention.

Turning to FIG. 2, an example of multi-level cell encoding 200 using multiple low density parity check codewords 201, 203, 205, 207, 209 to yield a series of five bit words that are encoded into write data in accordance with some embodiments of the present invention. Each of the low density parity check codewords 201, 203, 205, 207, 209 includes a number of bits indicated as positions (i.e., position 1, position 2, ... position n−1, and position n). It should be noted that an element (e.g., bit) of each of the respective codewords is found at each position. In some cases the element may be a filler value or an element from another codeword where a given codeword is shorter than another codeword. Thus, at position 1 a five bit word includes the first element of each of the five low density parity check codewords 201, 203, 205, 207, 209 (i.e., {$A_1$, $B_1$, $C_1$, $D_1$, $E_1$}). This is repeated for each of the positions 1 through n to yield n five bit words (i.e., {$A_2$, $B_2$, $C_2$, $D_2$, $E_2$} ... {$A_n$, $B_n$, $C_n$, $D_n$, $E_n$}).

Figure 3:
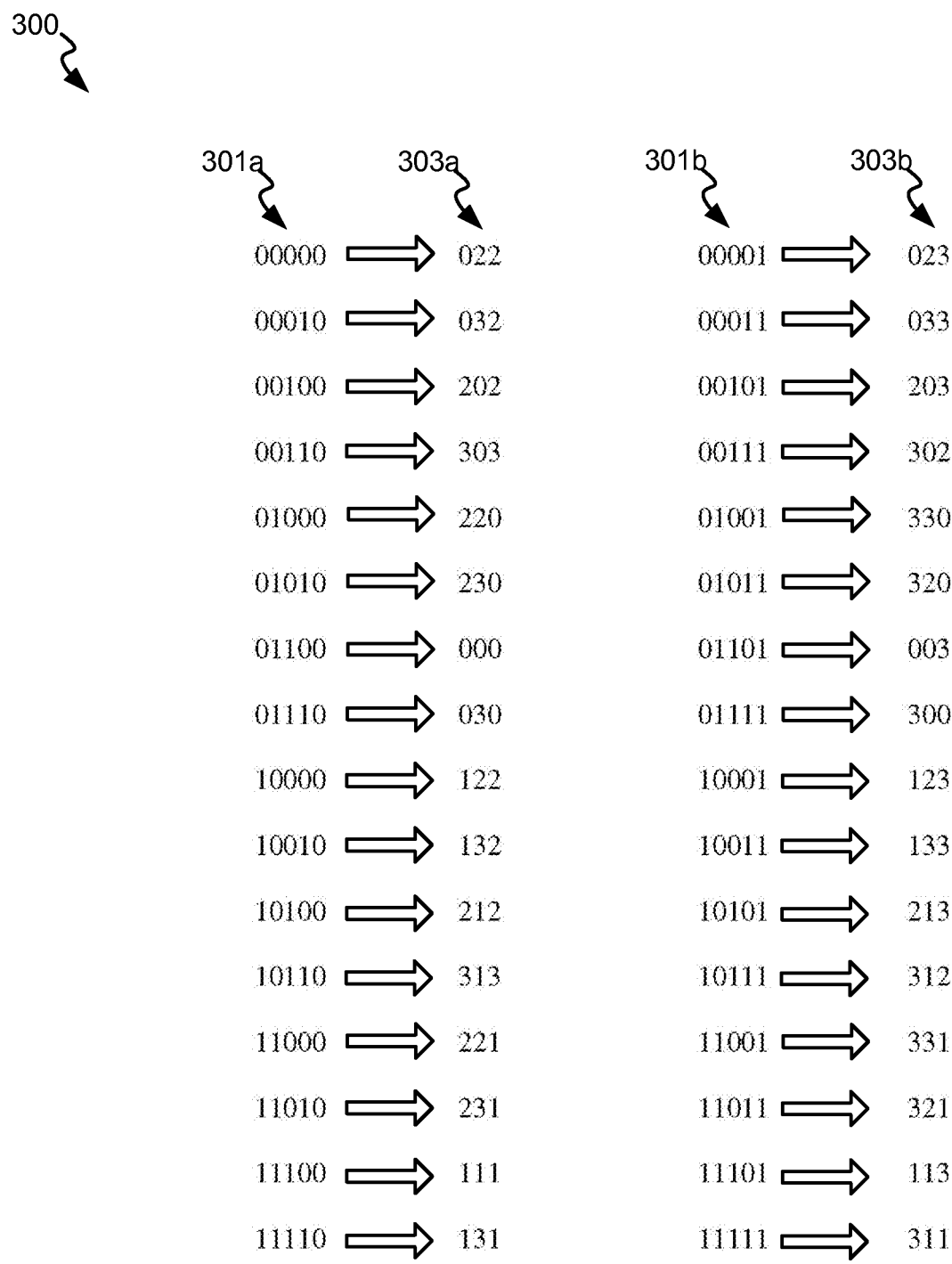
FIG. 3 shows a five bit word to three voltage levels conversion table in accordance with some embodiments of the present invention.
Figure 4A:
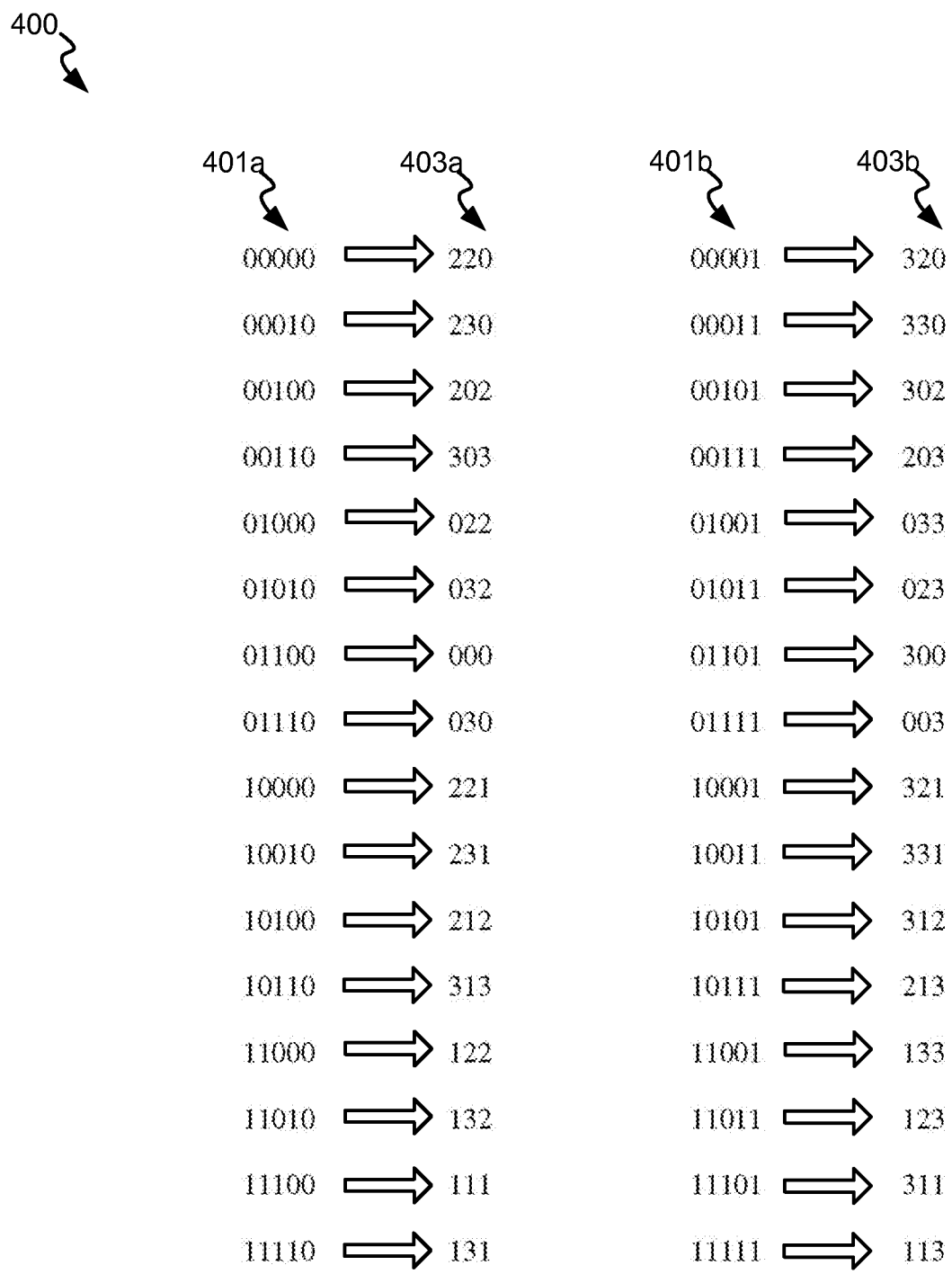
FIG. 4a shows another five bit word to three voltage levels conversion table in accordance with some embodiments of the present invention.

Returning to FIG. 1a, voltage value encoding circuit 109 encodes each of the n five bit words discussed in relation to FIG. 2 to a corresponding three value output that is provided as write data 111. Turning to FIG. 3, a five bit word 301a, 301b ({A, B, C, D, E}) to three voltage levels 303a, 303b ({X, Y, Z}) conversion table 300 is shown in accordance with some embodiments of the present invention. As shown, five bit word 301a, 301b correspond to the five bit words ({A, B, C, D, E}) discussed above in relation to FIG. 2. Thus, for example, where the five bit word is '00000' the corresponding three voltage levels ({X, Y, Z}) are "0, 2, 2". Similarly, where three voltage levels are "3, 1, 2" the corresponding five bit word is '10111'. Turning to FIG. 4a, another five bit word 401a, 401b ({A, B, C, D, E}) to three voltage levels 403a, 403b ({X, Y, Z}) conversion table 400 in accordance with some embodiments of the present invention. As shown, five bit word 401a, 401b correspond to the five bit words ({A, B, C, D, E}) discussed above in relation to FIG. 2. Thus, for example, where the five bit word is '00000' the corresponding three voltage levels ({X, Y, Z}) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 1a, write data 111 is provided to a write circuit 130. In addition, write circuit 130 receives an address 110 is received from host controller circuit 195. Write circuit 130 converts the voltage levels (e.g., {X, Y, Z}) received as write data 111 into a series of voltages 135 that are written to three cells of flash memory cells 140 indicated by address 110. Thus, for example, in the case where each cell of flash memory cells 140 are written as two bit cells, a voltage level of "0" (i.e., for a value of X, Y or Z equal to zero) results in voltage 135 being set below a lower threshold ($V_L$), a voltage level of "1" (i.e., for a value of X, Y or Z equal to one) results in voltage 135 being set above the lower threshold ($V_L$) and below a center threshold ($V_C$), a voltage level of "2" (i.e., for a value of X, Y or Z equal to two) results in voltage 135 being set above the center threshold ($V_C$) and below an upper threshold ($V_U$), and a voltage level of "3" (i.e., for a value of X, Y or Z equal to three) results in voltage 135 being set above the upper threshold ($V_U$). This process results in storing three voltage values respectively to three cells within flash memory cells to represent a five bit word. This process is repeated for each of the five bit words resulting in a group of multiple sets of three flash memory cells representing the five LDPC codewords received as LDPC codewords 107.

A data read is effectuated when host controller circuit 195 provides a read request indication 112 and address 110 to compaction enabled read controller and soft data output voltage value decoding circuit 180. Compaction enabled read controller and soft data output voltage value decoding circuit 180 translates read request 112 and address 110 into an address 154 and a threshold value 156 (or series of threshold values) that are provided to buffering read circuit 150. A read location 144 is generated based upon address 154 and provided to flash memory cells 140. In response, flash memory cells 140 provides return voltages 142 stored at the cells indicated by read location 144. Buffering read circuit 150 compares return voltages 142 with threshold 156 to yield corresponding binary values 152.

Processing of binary values 152 may be done using either with or without compaction based partial decoding. Compaction based partial decoding increases transfer efficiency with the reduction corresponding to the amount of duplication in a soft data mapping table. Where compaction is desired, compaction enabled read controller and soft data output voltage value decoding circuit 180 asserts a compaction page indicator 197 to compaction based partial decoder circuit 198. Based upon the enable, compaction based partial decoder circuit 198 reduces binary values 152 from one or more groups of three binary values to a ternary number represented as one or more groups of binary values that are provided as a output 199 to compaction enabled read controller and soft data output voltage value decoding circuit 180. An example of reducing binary values 152 from one group of three binary values to a ternary number represented as one group of two binary values that are provided as a output 199 to compaction enabled read controller and soft data output voltage value decoding circuit 180 is as follows:

| Binary Values 152 | Output 199 | Corresponding SD Value Provided as SD 182 |
| --- | --- | --- |
| 000 | 10 | 0.875 |
| 001 | 10 | 0.875 |
| 010 | 10 | 0.875 |
| 011 | 01 | 0.375 |
| 100 | 10 | 0.875 |
| 101 | 01 | 0.375 |
| 110 | 01 | 0.375 |
| 111 | 00 | −0.500 |

Compaction enabled read controller and soft data output voltage value decoding circuit 180 converts the ternary number received as a group of two bits via output 199 into a corresponding soft data value that is provided as soft data 182. Soft data 182 corresponding to the underlying LDPC codewords is provided low density parity check decoding circuit 190. Low density parity check decoding circuit 190 applies a low density parity check decoding algorithm to soft data 182 to yield recovered read data 192 that is provided to host controller circuit 195.

Alternatively, where compaction is not desired, compaction enabled read controller and soft data output voltage value decoding circuit 180 de-asserts compaction page indicator 197 to compaction based partial decoder circuit 198. Based upon the de-assertion of compaction page indicator 197, compaction based partial decoder circuit 198 simply passes binary values 152 through to compaction enabled read controller and soft data output voltage value decoding circuit 180 unchanged as output 199. Binary values 152 received as output 199 by compaction enabled read controller and soft data output voltage value decoding circuit 180 are decoded to yield soft data 182 corresponding to the underlying LDPC codewords (i.e., soft data representation of the originally encoded LDPC codewords 107). Soft data 182 corresponding to the underlying LDPC codewords is provided low density parity check decoding circuit 190. Low density parity check decoding circuit 190 applies a low density parity check decoding algorithm to soft data 182 to yield recovered read data 192 that is provided to host controller circuit 195.

Figure 4B:
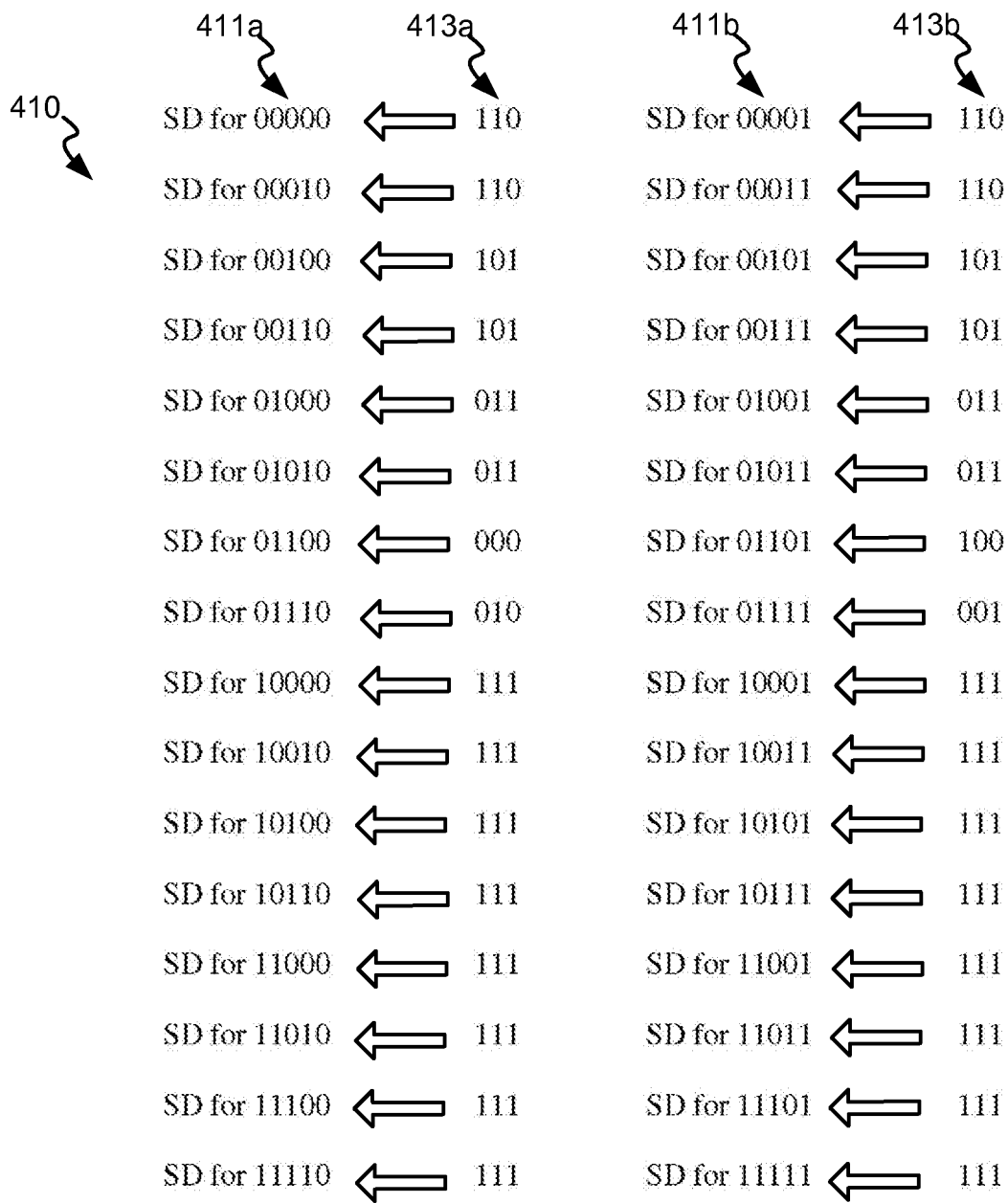
FIG. 4b shows a map corresponding to a lower threshold resolution of voltage levels of non-compacted hard data to soft data conversion in accordance with various embodiments of the present invention.
Figure 4C:
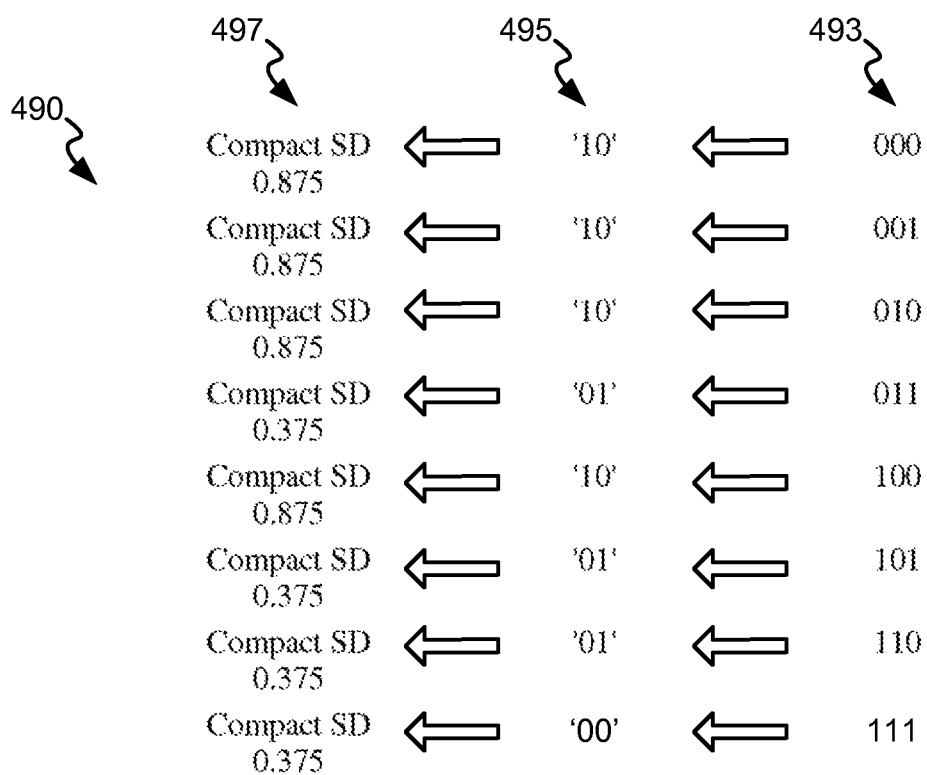
FIG. 4c shows a map corresponding to the lower threshold resolution of voltage levels of three bit compacted hard data to two bit soft data conversion in accordance with various embodiments of the present invention.

Turning to FIGS. 4b-4c, the two approaches (compacted and non-compacted) for resolving binary values to yield soft data 182 to be processed by LDPC decoding circuit 190 based on either on non-compacted or compacted hard data depending upon which type of processing is selected. Compacted hard data processing may be selected to increase transfer efficiency. In contrast, the non-compacted hard data processing generally results in reduced transfer efficiency.

Where compaction is not desired, a first part of the aforementioned process of comparing return voltages 142 with threshold 156 is shown in FIG. 4b where the conversion of FIG. 4a was used in the original encoding. This first part recovers a soft data representation of the first LDPC codeword (i.e., low density parity check codeword 201). As shown, a table 410 represents conversion of the three voltage levels 403a, 403b ({X, Y, Z}) of FIG. 4a where threshold 156 is the lower threshold ($V_L$). By comparing with $V_L$, any voltage value received as return voltages 142 that is less than $V_L$ (e.g., the voltage level of "0" discussed above) results in a binary '0', while any voltage value received as return voltages 142 that is greater than or equal to $V_L$ (e.g., the voltage levels of "1", "2" or "3" discussed above) results in a binary '1'. Thus, for example, where three cells of flash memory cells 140 return three voltage levels of "2, 2, 0", respectively, the corresponding binary output (i.e., binary values 152) is '110' (shown as values 413a, 413b). As another example, where three cells of flash memory cells 140 return three voltage levels of "3, 1, 2", respectively, the corresponding binary output is '111' (shown as values 413a, 413b). These binary values map to a single soft data value corresponding to one LDPC codeword (i.e., low density parity check codeword 201). Said another way, the three bit binary values 413a, 413b map to soft data for a corresponding five bit word (i.e., SD for XXXX 411a, 411b). The conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. Comparison of the next set of three cells of flash memory cells with $V_L$ is performed to yield the soft data value corresponding to the next bit of the LDPC codeword (i.e., low density parity check codeword 201). This process is repeated until soft data values corresponding to all bits of the LDPC codeword are generated (i.e., low density parity check codeword 201).

In some embodiments, the soft data values for any bit of a five bit word corresponding to the respective three bit binary values are calculated (either pre-calculated and stored to a look-up table, or calculated on the fly using a calculation circuit) in accordance with the following equation:

$$\text{Soft Data Value} = LLR(Y, p) = \ln\left(\frac{\text{Probability } [b_p = 0 \mid Y]}{\text{Probability } [b_p = 1 \mid Y]}\right),$$

where LLR is a log-likelihood ratio, Y represents the three bit value 413a, 413b derived from flash memory cells 140, p represents the position in the five bit word, and $b_p$ represents the binary value for the bit at position p. The aforementioned equation is derived based upon the following:

$$\text{Probability } (b_p, Y) = \sum_{\{b_i : i \neq p\}} \text{Probability } (C(b_0, b_1, \ldots, b_{N_p-1}) \mid Y),$$

where C are the three voltages provided from flash memory cells; where:

$$\text{Probability } (C, Y) = \frac{\text{Probability } (Y \mid C)}{\sum_{C'} \text{Probability } (Y \mid C')}, \text{ where}$$

$$\text{Probability } (Y, C) = \text{Probability } (Y \mid l(C)) = \prod_{i=0}^{L-1} \text{Probability } (y_i \mid l(c_i))$$

for the case of additive white Gaussian noise:

$$\text{Probability } (y = 0 \mid l) = \frac{1}{2}\left[1 + \text{erf}\left(\frac{t-l}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, p) = \ln\left(\frac{\text{Probability } [b_p = 0 \mid U]}{\text{Probability } [b_p = 1 \mid U]}\right),$$

where U represents a quantized version of the three bit value 413a, 413b derived from flash memory cells 140.

In contrast, where compaction is desired, an example of the first part of the aforementioned process of comparing return voltages 142 with threshold 156 are shown in FIG. 4c where the conversion of FIG. 4a was used in the original encoding. Such compaction based partial decoding increases transfer efficiency with the reduction corresponding to the amount of duplication in a soft data mapping table. Turning to FIG. 4c, one example shows the process of comparing return voltages 142 with a lower voltage threshold applied as threshold 156 to yield binary values 152, and using a tree bit to two bit conversion where only three possible soft data values (0.875, 0.375, or −0.500) for the first bit position (i.e., LDPC codeword 201). By compacting the table shown in FIG. 4b below to assign three soft data values to the respective three possible values for the first bit position. In particular, as shown in FIG. 4c, binary values 152 are shown in a column 493. Compaction based partial decoder circuit 198 converts the three bits provided as binary values 152 into a ternary number (0, 1, 2) represented as a two bit compacted value shown in a column 495. The two bit compacted value shown in column 495 is provided from compaction based partial decoder circuit 198 to compaction enabled read controller and soft data output voltage value decoding circuit 180. Compaction enabled read controller and soft data output voltage value decoding circuit 180 generates a de-compacted soft data value shown in a column 497 corresponding to the received ternary number. The generated de-compacted soft data value is provided by compaction enabled read controller and soft data output voltage value decoding circuit 180 as soft data output 182. In this example, the compaction goes from one group of three bits of binary values 152 into a single ternary number provided as output 199 resulting in a thirty-three percent data reduction.

In another compaction example where only three possible soft data values (0.875, 0.375, or −0.500) for the first bit position (i.e., LDPC codeword 201) are available, compaction based partial decoder circuit 198 may group three groups of bits of binary values 152 (i.e., a total of nine bits) into a five bit group representing three ternary numbers (i.e., three trits) representing twenty-seven possible combinations. Such compaction results in a forty-four percent data reduction. The five bit ternary number is provided as output 199 where it is converted into the three corresponding soft data values that are serially provided as soft data output 182 to LDPC decoding circuit 190.

As yet another compaction example where only three possible soft data values (0.875, 0.375, or −0.500) for the first bit position (i.e., LDPC codeword 201) are available, compaction based partial decoder circuit 198 may group five groups of bits of binary values 152 (i.e., a total of fifteen bits) into an eight bit group representing five ternary numbers (i.e., five trits) representing two-hundred, forty-three possible combinations. Such compaction results in a fourty-seven percent data reduction. The eight bit ternary number is provided as output 199 where it is converted into the five corresponding soft data values that are serially provided as soft data output 182 to LDPC decoding circuit 190.

Figure 4D:
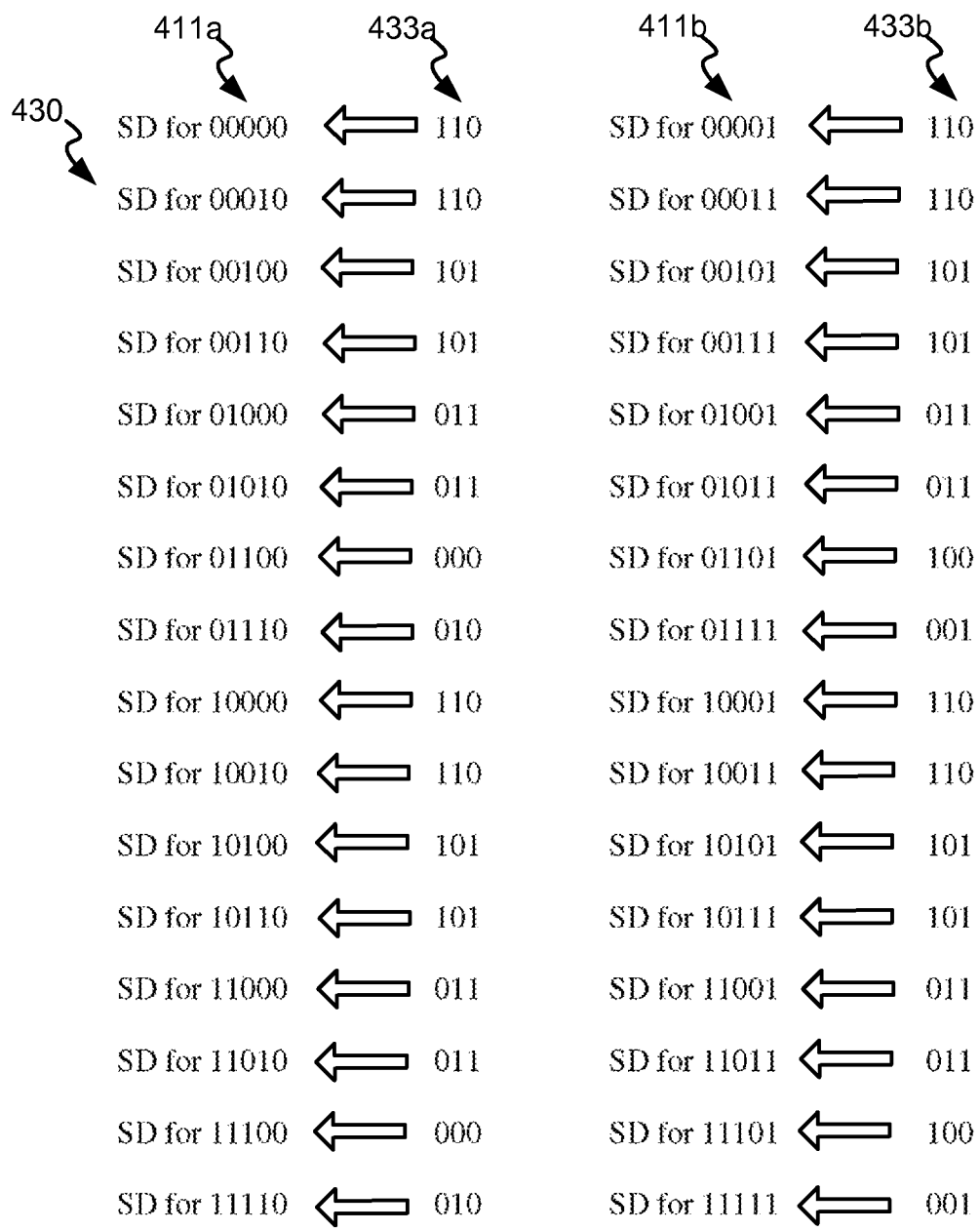
FIG. 4d shows a map corresponding to a center threshold resolution of voltage levels of non-compacted hard data to soft data conversion in accordance with various embodiments of the present invention.

Turning to FIG. 4d, a second part of the aforementioned process of comparing return voltages 142 with threshold 156 is shown where the conversion of FIG. 4a was used in the original encoding. This second part recovers the second and third LDPC codewords (i.e., low density parity check codeword 203 and low density parity check codeword 205). As shown, a table 430 represents conversion of the three voltage levels 403a, 403b ({X, Y, Z}) of FIG. 4a where threshold 156 is the center threshold ($V_C$). By comparing with $V_C$, any voltage value received as return voltages 142 that is less than $V_C$ (e.g., the voltage levels of "0" or "1" discussed above) results in a binary '0', while any voltage value received as return voltages 142 that is greater than or equal to $V_C$ (e.g., the voltage levels of "2" or "3" discussed above) results in a binary '1'. Thus, for example, where three cells of flash memory cells 140 return three voltage levels of "2, 2, 0", respectively, the corresponding binary output (i.e., binary values 152) is '110' (shown as values 433a, 433b). As another example, where three cells of flash memory cells 140 return three voltage levels of "3, 1, 2", respectively, the corresponding binary output is '101' (shown as values 433a, 433b). These binary values map to two soft data values corresponding to two LDPC codewords (i.e., low density parity check codeword 203 and low density parity check codeword 205). Said another way, the three bit binary values 433a, 433b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_C$ is performed to yield the soft data values corresponding to the next bits of the two LDPC codewords (i.e., low density parity check codeword 203 and low density parity check codeword 205). This process is repeated until soft data values corresponding to all bits of the LDPC codewords are generated (i.e., low density parity check codeword 203 and low density parity check codeword 205). Of note, a '111' pattern is an invalid value, but a soft data value is generated for it and all other valid patterns.

Of note, while not discussed herein, the same selection process between compaction and non-compaction can be used in relation to recovering the information in the second and third LDPC codewords. However, as the duplication shown in FIG. 4d is not as significant as that shown in FIG. 4b, the increase in transfer efficiency is not as great.

Figure 4E:
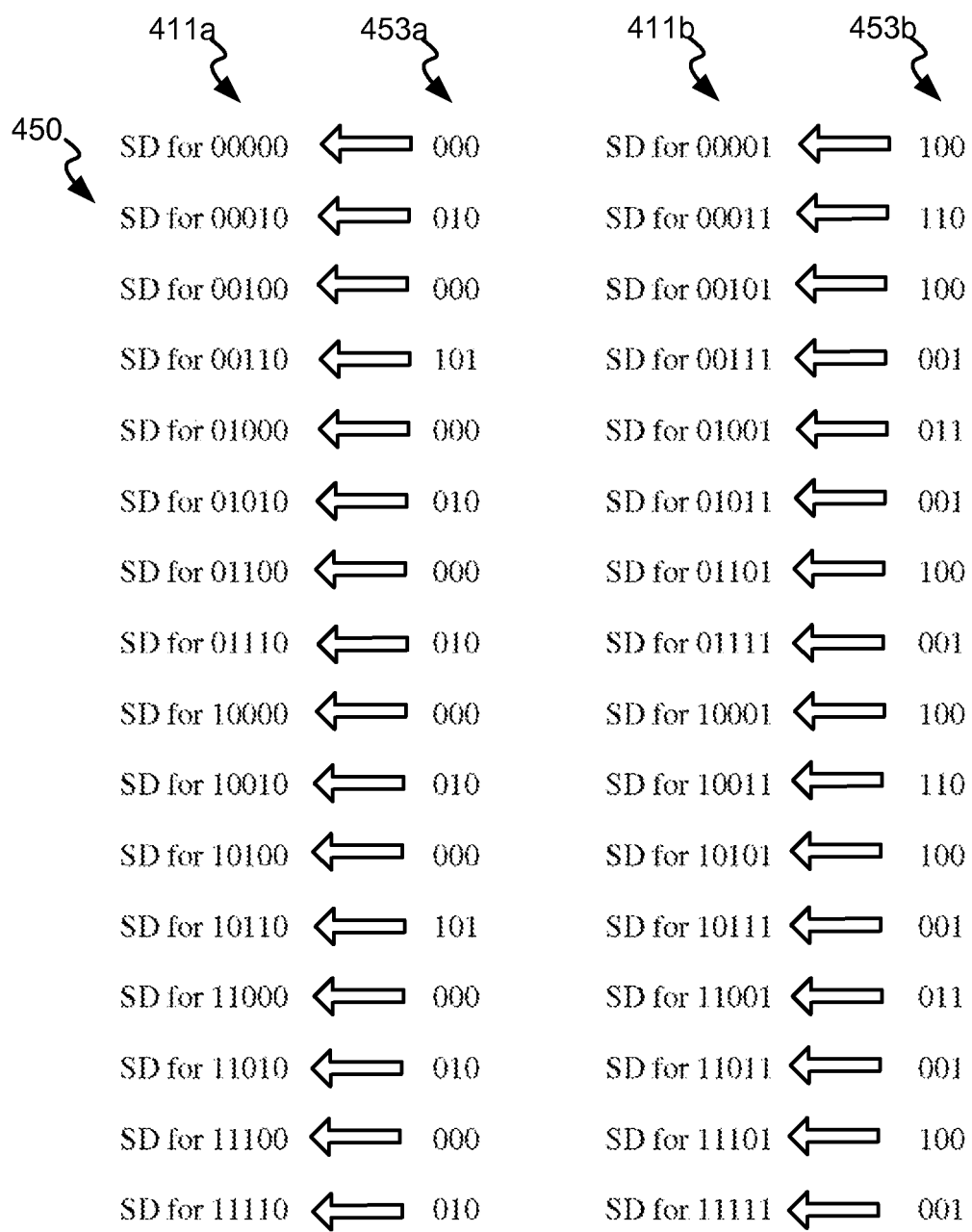
FIG. 4e shows a map corresponding to an upper threshold resolution of voltage levels of non-compacted hard data to soft data conversion in accordance with various embodiments of the present invention.

Turning to FIG. 4e, a third part of the aforementioned process of comparing return voltages 142 with threshold 156 is shown where the conversion of FIG. 4a was used in the original encoding. This third part recovers the fourth and fifth LDPC codewords (i.e., low density parity check codeword 207 and low density parity check codeword 209). As shown, a table 450 represents conversion of the three voltage levels 403a, 403b ({X, Y, Z}) of FIG. 4a where threshold 156 is the upper threshold ($V_U$). By comparing with $V_U$, any voltage value received as return voltages 142 that is less than $V_U$ (e.g., the voltage levels of "0" or "1" discussed above) results in a binary '0', while any voltage value received as return voltages 142 that is greater than or equal to $V_U$ (e.g., the voltage levels of "2" or "3" discussed above) results in a binary '1'. Thus, for example, where three cells of flash memory cells 140 return three voltage levels of "2, 2, 0", respectively, the corresponding binary output (i.e., binary values 152) is '000' (shown as values 453a, 453b). As another example, where three cells of flash memory cells 140 return three voltage levels of "3, 1, 2", respectively, the corresponding binary output is '100' (shown as values 453a, 453b). These binary values map to two soft data values corresponding to two LDPC codewords (i.e., low density parity check codeword 203 and low density parity check codeword 205). Said another way, the three bit binary values 453a, 453b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_U$ is performed to yield the soft data values corresponding to the next bits of the two LDPC codewords (i.e., low density parity check codeword 207 and low density parity check codeword 209). This process is repeated until soft data values corresponding to all bits of the LDPC codewords are generated (i.e., low density parity check codeword 207 and low density parity check codeword 209). Of note, a '111' pattern is an invalid value, but a soft data value is generated for it and all other valid patterns.

Of note, while not discussed herein, the same selection process between compaction and non-compaction can be used in relation to recovering the information in the fourth and fifth LDPC codewords. However, as the duplication shown in FIG. 4e is not as significant as that shown in FIG. 4b, the increase in transfer efficiency is not as great.

Figure 1B:
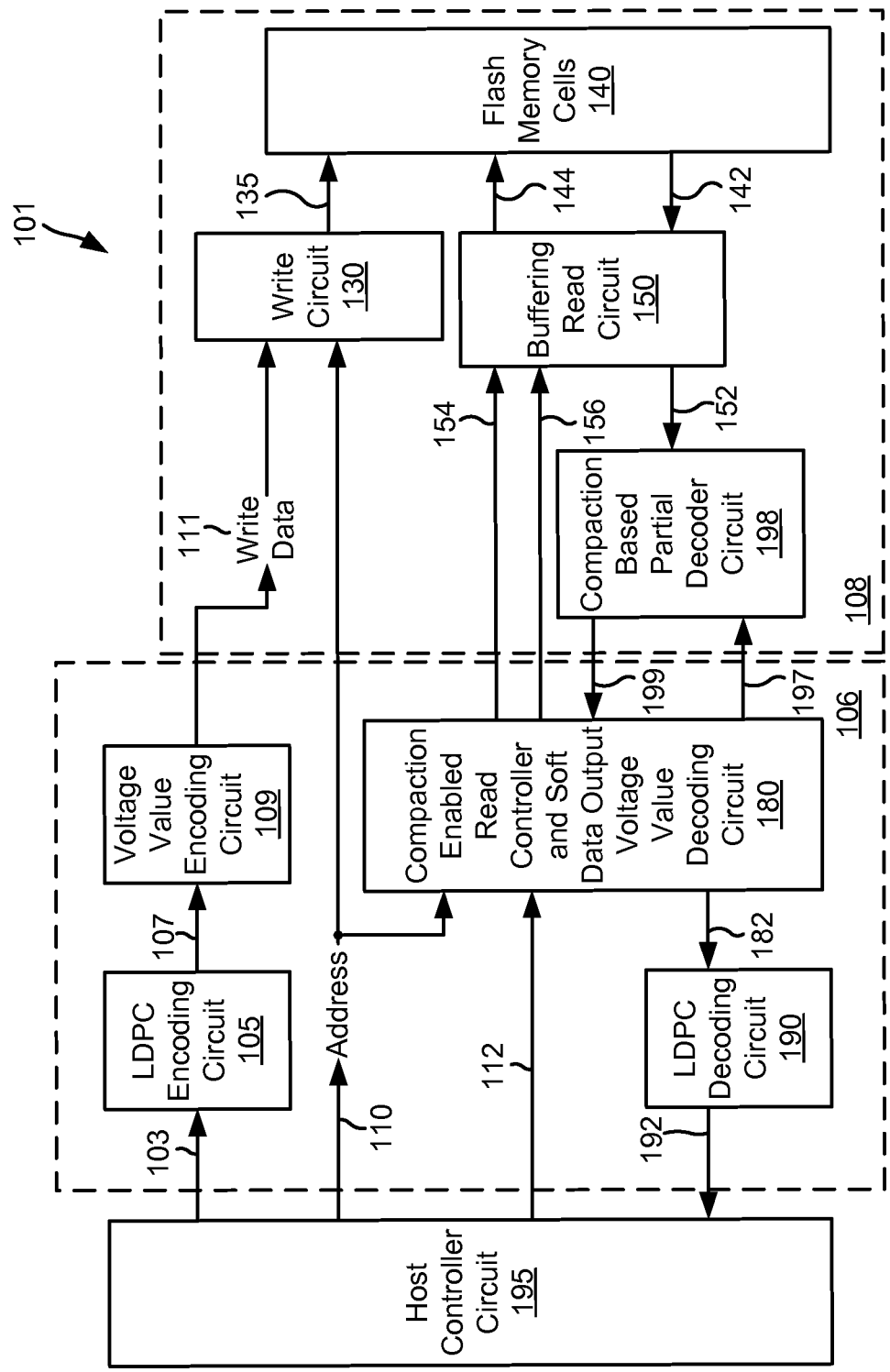
FIG. 1b shows a solid state storage system including a compaction based partial decoder circuit implemented on a semiconductor die along with flash memory cells in accordance with some embodiments of the present invention.

Turning to FIG. 1b, a solid state storage system 101 is shown that includes a compaction based partial decoder circuit 198 implemented on a semiconductor die 108 on which flash memory cells 140 are implemented in accordance with some embodiments of the present invention. Solid state storage system 101 includes a host controller circuit 195, a low density parity check encoding circuit 105, a voltage value encoding circuit 109, a write circuit 130, flash memory cells 140, a buffering read circuit 150, a compaction enabled read controller and soft data output voltage value decoding circuit 180, and a low density parity check decoding circuit 190. Host controller circuit 195 directs read and write access to flash memory cells 140. Flash memory cells 140 may be NAND flash memory cells or another type of solid state memory cells as are known in the art.

Solid state storage system 101 is implemented using at least two distinct semiconductor dies. Semiconductor die 106 includes low density parity check encoding circuit 105, voltage value encoding circuit 109, compaction enabled read controller and soft data output voltage value decoding circuit 180, and low density parity check decoding circuit 190. Semiconductor die 108 includes write circuit 130, compaction based partial decoder circuit 198 flash memory cells 140, and buffering read circuit 150. It should be noted that while solid state storage system 101 is shown as distributed across two or more semiconductor dies, that other embodiments of the present invention may be implemented with a semiconductor die that includes all of low density parity check encoding circuit 105, voltage value encoding circuit 109, write circuit 130, flash memory cells 140, buffering read circuit 150, compaction enabled read controller and soft data output voltage value decoding circuit 180, and low density parity check decoding circuit 190. Yet other embodiments of the present invention may be implemented with a semiconductor die that includes all of low density parity check encoding circuit 105, voltage value encoding circuit 109, write circuit 130, flash memory cells 140, buffering read circuit 150, compaction enabled read controller and soft data output voltage value decoding circuit 180, low density parity check decoding circuit 190, and host controller circuit 195.

Figure 5:
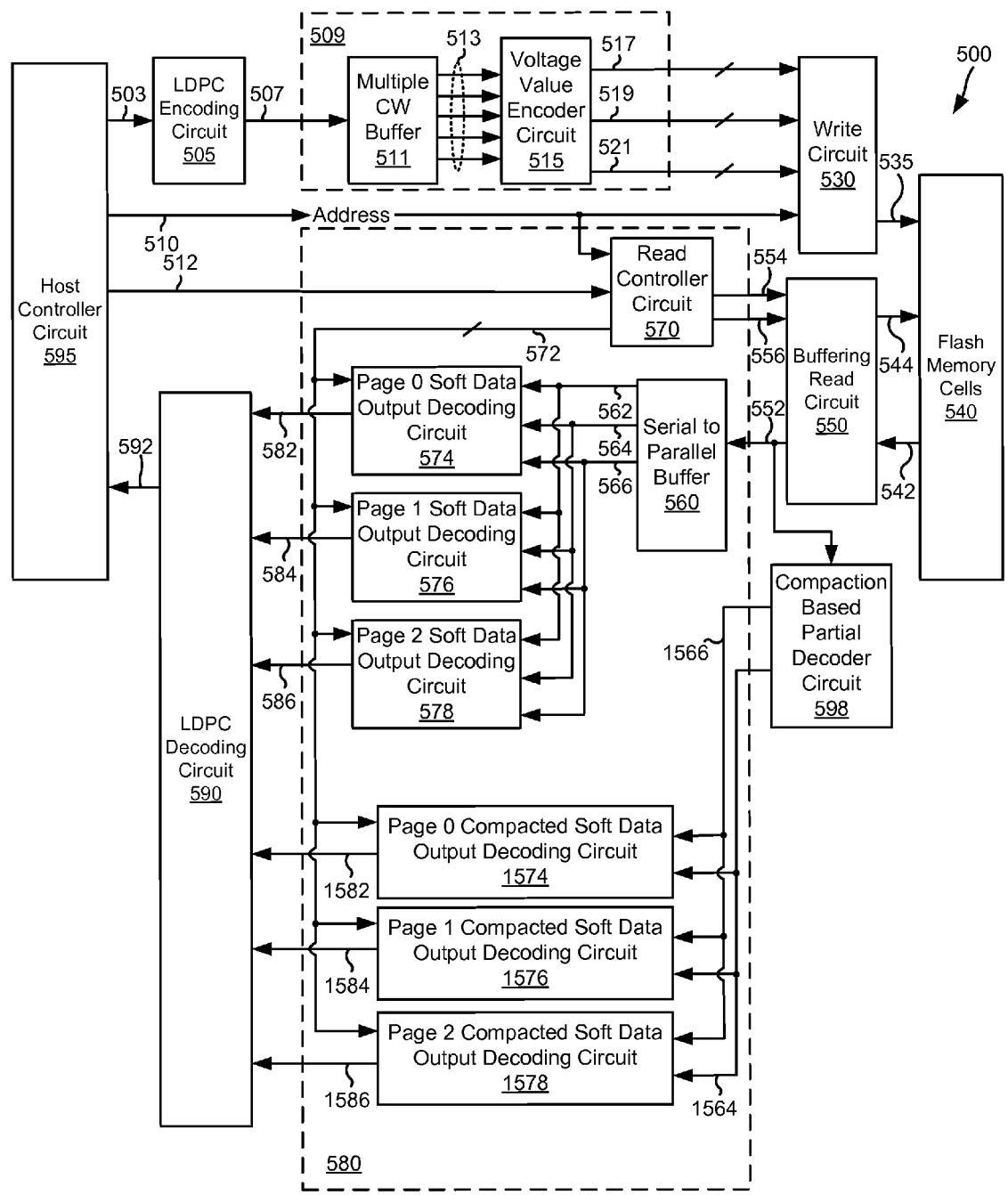
FIG. 5 shows a more detailed example of a solid state storage system including a compaction based partial decoder circuit in accordance with some embodiments of the present invention.

Turning to FIG. 5, a solid state storage system 500 is shown that includes a compaction based partial decoder circuit 598 in accordance with some embodiments of the present invention. Solid state storage system 500 includes a host controller circuit 595, a low density parity check encoding circuit 505, a voltage value encoding circuit 509 shown in dashed lines, a write circuit 530, flash memory cells 540, a read circuit 550, compaction based partial decoder circuit 598, a compaction enabled read controller and soft data output voltage value decoding circuit 580 shown in dashed lines, and a low density parity check decoding circuit 590. Compaction enabled read controller and soft data output voltage value decoding circuit 580 includes a read controller circuit 570, a serial to parallel buffer circuit 560, and three non-compacted page soft data output decoding circuits 574, 576, 578, and three compacted page soft data output decoding circuits 1574, 1576, 1578. Voltage value encoding circuit 509 includes a multiple codeword buffer circuit 511 and a multi-level cell encoder circuit 515. Host controller circuit 595 directs read and write access to flash memory cells 540. Flash memory cells 540 may be NAND flash memory cells or another type of solid state memory cells as are known in the art.

A data write is effectuated when host controller circuit 595 provides input data 503 to low density parity check encoding circuit 505. Low density parity check encoding circuit 505 applies a low density parity check encoding algorithm to input data 503 to yield LDPC codewords 507. Low density parity check encoding circuit 505 may be any circuit known in the art that is capable of receiving user data and generating corresponding low density parity check codewords. LDPC codewords 507 are provided to multi-level cell encoding circuit 509. Multiple codeword buffer circuit 511 of voltage value encoding circuit 509 stores five LDPC codewords received as LDPC codewords 507. Individual bits of each of the five stored codewords are selected and provided as a five bit word 513. This process is repeated for each bit position of the respective LDPC codewords resulting in a series of five bit words 513 being provided sequentially to multi-level cell encoder circuit 515 where the five bit words are encoded as three voltage values 517, 519, 521. Voltage value 517 corresponds to a voltage level that is to be written to a first of a three cell block of flash memory cells 540, voltage value 519 corresponds to a voltage level that is to be written to a second of the three cell block of flash memory cells 140, and voltage value 521 corresponds to a voltage level that is to be written to a third of the three cell block of flash memory cells 540. In some embodiments, voltage values 517, 519, 521 may be one of four voltage levels each representing a two-bit pattern stored in a given cell of flash memory cells 540. It should be noted that in other embodiments, eight or more voltage levels representing three or more bits stored in a given cell of flash memory cells 540 are possible in accordance with other embodiments of the present invention.

Turning to FIG. 2, multi-level cell encoding 200 is shown using multiple low density parity check codewords 201, 203, 205, 207, 209 to yield a series of five bit words 513 that are encoded into write data in accordance with some embodiments of the present invention. Each of the low density parity check codewords 201, 203, 205, 207, 209 includes a number of bits indicated as positions (i.e., position 1, position 2, . . . position n−1, and position n). Thus, at position 1 a five bit word 513 includes the first element of each of the five low density parity check codewords 201, 203, 205, 207, 209 (i.e., $\{A_1, B_1, C_1, D_1, E_1\}$). This is repeated for each of the positions 1 through n to yield n five bit words 513 (i.e., $\{A_2, B_2, C_2, D_2, E_2\} \ldots \{A_n, B_n, C_n, D_n, E_n\}$).

Returning to FIG. 5, multi-level cell encoder circuit 515 encodes each of the n five bit words 513 to a corresponding three value output that is provided as voltage values 517, 519, 521 to write circuit 530. Turning to FIG. 3, a five bit word 301a, 301b ($\{A, B, C, D, E\}$) to three voltage levels 303a, 303b ($\{X, Y, Z\}$) conversion table 300 is shown in accordance with some embodiments of the present invention. As shown, five bit word 301a, 301b correspond to the five bit words ({A, B, C, D, E}) discussed above in relation to FIG. 2. Thus, for example, where the five bit word is '00000' the corresponding three voltage levels ({X, Y, Z}) are "0, 2, 2". Similarly, where three voltage levels are "3, 1, 2" the corresponding five bit word is '10111'. Turning to FIG. 4a, another five bit word 401a, 401b ({A, B, C, D, E}) to three voltage levels 403a, 403b ({X, Y, Z}) conversion table 400 in accordance with some embodiments of the present invention. As shown, five bit word 401a, 401b correspond to the five bit words ({A, B, C, D, E}) discussed above in relation to FIG. 2. Thus, for example, where the five bit word is '00000' the corresponding three voltage levels ({X, Y, Z}) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 5, write circuit 530 additionally receives an address 510 from host controller circuit 595. Write circuit 530 converts voltage values 517, 519, 521 (e.g., {X, Y, Z}) into a series of voltages 535 that are written to three cells of flash memory cells 540 indicated by address 510. Thus, for example, in the case where each cell of flash memory cells 540 are written as two bit cells, a voltage level of "0" (i.e., for a value of X, Y or Z equal to zero) results in voltage 535 being set below a lower threshold ($V_L$), a voltage level of "1" (i.e., for a value of X, Y or Z equal to one) results in voltage 535 being set above the lower threshold ($V_L$) and below a center threshold ($V_C$), a voltage level of "2" (i.e., for a value of X, Y or Z equal to two) results in voltage 535 being set above the center threshold ($V_C$) and below an upper threshold ($V_U$), and a voltage level of "3" (i.e., for a value of X, Y or Z equal to three) results in voltage 535 being set above the upper threshold ($V_U$). This process results in storing three voltage values respectively to three cells within flash memory cells to represent a five bit word. This process is repeated for each of the five bit words resulting in a group of multiple sets of three flash memory cells representing the five LDPC codewords received as LDPC codewords 507.

A data read is effectuated when host controller circuit 595 provides a read request indication 512 and address 510 to read controller circuit 570 of compaction enabled read controller and soft data output voltage value decoding circuit 580. Read controller circuit 570 translates read request 512 and address 510 into an address 554 and a threshold value 556 (or series of threshold values) that are provided to read circuit 550. A read location 544 is generated by read circuit 550 based upon address 554 and provided to flash memory cells 540. In response, flash memory cells 540 provides return voltages 542 stored at the cells indicated by read location 544. Read circuit 550 compares return voltages 542 with threshold 556 to yield corresponding binary values 552.

Binary values 552 are provided to serial to parallel buffer 560 that assembles the binary values into sets of three bits 562, 564, 566 associated with the same five bit words. Bits 562, 564, 566 are provided to each of page 0 soft data output decoding circuit 574, page 1 soft data output decoding circuit 576, and page 2 soft data output decoding circuit 578. Based upon the ongoing read, read controller circuit 570 asserts various enables 572 that enable operation of respective ones of page 0 soft data output decoding circuit 574, page 1 soft data output decoding circuit 576, and page 2 soft data output decoding circuit 578. In particular, when soft data corresponding to all of the codewords associated with the five bit words is to be generated, read controller circuit 570 sequentially provides: the lower threshold ($V_L$) to obtain the soft data corresponding to the first LDPC codeword represented in the five bit words, the center threshold ($V_C$) to obtain the soft data corresponding to the second and third LDPC codewords represented in the five bit words, and the upper threshold ($V_U$) to obtain the soft data corresponding to the fourth and fifth LDPC codewords represented in the five bit words as threshold value 556. Where soft data corresponding to only specific ones of the LDPC codewords represented in the five bit words is to be generated, some subset of the lower threshold ($V_L$), the center threshold ($V_C$), and/or the upper threshold ($V_U$) are sequentially presented as threshold value 556. For example, where soft data for only the third and fourth LDPC codewords is to be generated, the center threshold ($V_C$), and/or the upper threshold ($V_U$) are sequentially presented as threshold value 556. As another example, where soft data for only the fifth LDPC codeword is to be generated, only the upper threshold ($V_U$) is presented.

When the upper threshold ($V_U$) is presented as threshold value 556, enables 572 are asserted by read controller circuit 570 such that operation of page 2 soft data output decoding circuit 578 is enabled, while operation of page 0 soft data output decoding circuit 574 and page 1 soft data output decoding circuit 576 is disabled. Alternatively, when the center threshold ($V_C$) is presented as threshold value 556, enables 572 are asserted by read controller circuit 570 such that operation of page 1 soft data output decoding circuit 576 is enabled, while operation of page 0 soft data output decoding circuit 574 and page 2 soft data output decoding circuit 578 is disabled. As the other alternative, when the lower threshold ($V_L$) is presented as threshold value 556, enables 572 are asserted by read controller circuit 570 such that operation of page 0 soft data output decoding circuit 574 is enabled, while operation of page 1 soft data output decoding circuit 576 and page 2 soft data output decoding circuit 578 is disabled.

When enabled, page 0 soft data output decoding circuit 574 generates soft data corresponding to the first LDPC codeword represented in the five bit words based upon bits 562, 564, 566 corresponding to the result of comparing return voltages 542 with the lower threshold ($V_L$). The generated soft data corresponding to the first LDPC codeword is provided as a soft data output 582 to LDPC decoding circuit 590. Similarly, when enabled, page 1 soft data output decoding circuit 576 generates soft data corresponding to the second and third LDPC codewords represented in the five bit words based upon bits 562, 564, 566 corresponding to the result of comparing return voltages 542 with the center threshold ($V_C$). The generated soft data corresponding to the second and third LDPC codewords is provided as a soft data output 584 to LDPC decoding circuit 590. Similarly, when enabled, page 2 soft data output decoding circuit 578 generates soft data corresponding to the fourth and fifth LDPC codewords represented in the five bit words based upon bits 562, 564, 566 corresponding to the result of comparing return voltages 542 with the upper threshold ($V_U$). The generated soft data corresponding to the fourth and fifth LDPC codewords is provided as a soft data output 586 to LDPC decoding circuit 590.

In addition, binary values 552 are provided to compaction based partial decoder circuit 598 that compacts the binary values 552 into corresponding ternary numbers that are provided via a multi-line interface 1564, 1566 to compacted page soft data output decoding circuits 1574, 1576, 1578. In particular, compaction based partial decoder circuit 598 reduces binary values 552 from one or more groups of three binary values to a ternary number represented as a group of two binary values that are provided as a output 599 to compaction enabled read controller and soft data output voltage value decoding circuit 580. An example of reducing binary values 552 from one group of three binary values to a ternary number represented as one group of two binary values that are provided as a output 599 to compaction enabled read controller and soft data output voltage value decoding circuit 580 is as follows:

| Binary Values 552 | Multi-line Interface 1564, 1566 | Corresponding SD Value |
|---|---|---|
| 000 | 10 | 0.875 |
| 001 | 10 | 0.875 |
| 010 | 10 | 0.875 |
| 011 | 01 | 0.375 |
| 100 | 10 | 0.875 |
| 101 | 01 | 0.375 |
| 110 | 01 | 0.375 |
| 111 | 00 | −0.500 |

Compaction enabled read controller and soft data output voltage value decoding circuit 580 converts the ternary number received as multi-line interface 1564, 1566 into a corresponding soft data value that is provided to LDPC decoding circuit 590.

In particular, where page 0 is being decoded (i.e., low density parity check codeword 201), page 0 compacted soft data output decoding circuit 1574 generates one or more soft data values corresponding to the ternary number received via multi-line interface 1564, 1566. The generated soft data is provided as a soft data output 1582 when page 0 is enabled by enables 572. In some embodiments of the present invention, page 0 compacted soft data output decoding circuit 1574 is a look-up table. In other embodiments of the present invention, page 0 compacted soft data output decoding circuit 1574 is a non-table based data conversion circuit. Similarly, where page 1 is being decoded (i.e., low density parity check codeword 203 and low density parity check codeword 205), page 1 compacted soft data output decoding circuit 1576 generates one or more soft data values corresponding to the ternary number received via multi-line interface 1564, 1566. The generated soft data is provided as a soft data output 1584 when page 1 is enabled by enables 572. In some embodiments of the present invention, page 1 compacted soft data output decoding circuit 1576 is a look-up table. In other embodiments of the present invention, page 1 compacted soft data output decoding circuit 1576 is a non-table based data conversion circuit. Similarly, where page 2 is being decoded (i.e., low density parity check codeword 207 and low density parity check codeword 209), page 2 compacted soft data output decoding circuit 1578 generates one or more soft data values corresponding to the ternary number received via multi-line interface 1564, 1566. The generated soft data is provided as a soft data output 1586 when page 2 is enabled by enables 572. In some embodiments of the present invention, page 2 compacted soft data output decoding circuit 1578 is a look-up table. In other embodiments of the present invention, page 2 compacted soft data output decoding circuit 1578 is a non-table based data conversion circuit.

It should be noted that while solid state storage system 500 is shown as including both compacted and non-compacted decoding circuitry for all pages allowing for a wide range of selecting combinations of compacted and/or non-compacted operations on a page by page basis, other embodiments may include less circuitry. For example, one embodiment may only include compacted decoding circuitry for each of the pages (i.e., serial to parallel buffer 560, page 0 soft output decoding circuit 574, page 1 soft output decoding circuit 576, and page 2 soft output decoding circuit 578 are eliminated). As another example, another embodiment may include only compacted decoding circuitry for page 0 and only non-compacted decoding circuitry for page 1 and page 2 (i.e., page 0 soft output decoding circuit 574, page 1 compacted soft output decoding circuit 1576, and page 2 compacted soft output decoding circuit 1578 are eliminated). Based upon the disclosure provided herein, one of ordinary skill in the art will recognize other combinations that are possible in accordance with other embodiments of the present invention.

Turning to FIGS. 4b-4c, the two approaches (compacted and non-compacted) for resolving binary values to yield the soft data to be processed by LDPC decoding circuit 590 based on either on non-compacted or compacted hard data depending upon which type of processing is selected. Compacted hard data processing may be selected to increase transfer efficiency. In contrast, the non-compacted hard data processing generally results in reduced transfer efficiency.

Where compaction is not desired, a first part of the aforementioned process of comparing return voltages 542 with threshold 556 is shown in FIG. 4b where the conversion of FIG. 4a was used in the original encoding. This first part recovers a soft data representation of the first LDPC codeword (i.e., low density parity check codeword 201). As shown, a table 410 represents conversion of the three voltage levels 403a, 403b ({X, Y, Z}) of FIG. 4a where threshold 556 is the lower threshold ($V_L$). By comparing with $V_L$, any voltage value received as return voltages 542 that is less than $V_L$ (e.g., the voltage level of "0" discussed above) results in a binary '0', while any voltage value received as return voltages 542 that is greater than or equal to $V_L$ (e.g., the voltage levels of "1", "2" or "3" discussed above) results in a binary '1'. Thus, for example, where three cells of flash memory cells 540 return three voltage levels of "2, 2, 0", respectively, the corresponding binary output (i.e., binary values 552) is '110' (shown as values 413a, 413b). As another example, where three cells of flash memory cells 540 return three voltage levels of "3, 1, 2", respectively, the corresponding binary output is '111' (shown as values 413a, 413b). These binary values map to a single soft data value corresponding to one LDPC codeword (i.e., low density parity check codeword 201). Said another way, the three bit binary values 413a, 413b map to soft data for a corresponding five bit word (i.e., SD for XXXX 411a, 411b). The conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. Comparison of the next set of three cells of flash memory cells with $V_L$ is performed to yield the soft data value corresponding to the next bit of the LDPC codeword (i.e., low density parity check codeword 201). This process is repeated until soft data values corresponding to all bits of the LDPC codeword are generated (i.e., low density parity check codeword 201).

In some embodiments, the soft data values for any bit of a five bit word corresponding to the respective three bit binary values are calculated (either pre-calculated and stored to a look-up table, or calculated on the fly using a calculation circuit) in accordance with the following equation:

$$\text{Soft Data Value} = LLR(Y, p) = \ln\left(\frac{\text{Probability } [b_p = 0 \mid Y]}{\text{Probability } [b_p = 1 \mid Y]}\right),$$

where LLR is a log-likelihood ratio, Y represents the three bit value 413a, 413b derived from flash memory cells 540, p represents the position in the five bit word, and $b_p$ represents the binary value for the bit at position p. The aforementioned equation is derived based upon the following:

$$\text{Probability } (b_p, Y) = \sum_{\{b_i : i \neq p\}} \text{Probability } (C(b_0, b_1, \ldots, b_{N_p-1}) \mid Y),$$

where C are the three voltages provided from flash memory cells; where:

$$\text{Probability } (C, Y) = \frac{\text{Probability } (Y \mid C)}{\sum_{C'} \text{Probability } (Y \mid C')}, \text{ where}$$

$$\text{Probability } (Y, C) = \text{Probability } (Y \mid l(C)) = \prod_{i=0}^{L-1} \text{Probability } (y_i \mid l(c_i))$$

for the case of additive white Gaussian noise:

$$\text{Probability } (y = 0 \mid l) = \frac{1}{2}\left[1 + \text{erf}\left(\frac{t-l}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, p) = \ln\left(\frac{\text{Probability } [b_p = 0 \mid U]}{\text{Probability } [b_p = 1 \mid U]}\right),$$

where U represents a quantized version of the three bit value 413a, 413b derived from flash memory cells 540.

In contrast, where compaction is desired, an example of the first part of the aforementioned process of comparing return voltages 542 with threshold 556 are shown in FIG. 4c where the conversion of FIG. 4a was used in the original encoding. Such compaction based partial decoding increases transfer efficiency with the reduction corresponding to the amount of duplication in a soft data mapping table. Turning to FIG. 4c, one example shows the process of comparing return voltages 542 with a lower voltage threshold applied as threshold 556 to yield binary values 552, and using a tree bit to two bit conversion where only three possible soft data values (0.875, 0.375, or −0.500) for the first bit position (i.e., LDPC codeword 201). By compacting the table shown in FIG. 4b below to assign three soft data values to the respective three possible values for the first bit position. In particular, as shown in FIG. 4c, binary values 552 are shown in a column 493. Compaction based partial decoder circuit 598 converts the three bits provided as binary values 552 into a ternary number (0, 1, 2) represented as a two bit value shown in a column 495. The two bit value shown in column 495 is provided from compaction based partial decoder circuit 598 to compaction enabled read controller and soft data output voltage value decoding circuit 580. Compaction enabled read controller and soft data output voltage value decoding circuit 580 generates a soft data value shown in a column 497 corresponding to the received ternary number. The generated soft data value is provided by compaction enabled read controller and soft data output voltage value decoding circuit 580 as soft data output 582. In this example, the compaction goes from one group of three bits of binary values 552 into a single ternary number (which can be represented by two bits) provided as output 599 resulting in a thirty-three percent data reduction.

In another compaction example where only three possible soft data values (0.875, 0.375, or −0.500) for the first bit position (i.e., LDPC codeword 201) are available, compaction based partial decoder circuit 598 may group three groups of bits of binary values 552 (i.e., a total of nine bits) into into a five bit group representing three ternary numbers (i.e., three trits) representing twenty-seven possible combinations. Such compaction results in a forty-four percent data reduction. The five bit ternary number is provided as output 599 where it is converted into the three corresponding soft data values that are serially provided as soft data output 582 to LDPC decoding circuit 590.

As yet another compaction example where only three possible soft data values (0.875, 0.375, or −0.500) for the first bit position (i.e., LDPC codeword 201) are available, compaction based partial decoder circuit 598 may group five groups of bits of binary values 552 (i.e., a total of fifteen bits) into an eight bit group representing five ternary numbers (i.e., five trits) representing two-hundred, forty-three possible combinations. Such compaction results in a forty-seven percent data reduction. The eight bit ternary number is provided as output 599 where it is converted into the five corresponding soft data values that are serially provided as soft data output 582 to LDPC decoding circuit 590.

Turning to FIG. 4d, a second part of the aforementioned process of comparing return voltages 542 with threshold 556 is shown where the conversion of FIG. 4a was used in the original encoding. This second part recovers the second and third LDPC codewords (i.e., low density parity check codeword 203 and low density parity check codeword 205). As shown, a table 430 represents conversion of the three voltage levels 403a, 403b ({X, Y, Z}) of FIG. 4a where threshold 556 is the center threshold ($V_C$). By comparing with $V_C$, any voltage value received as return voltages 542 that is less than $V_C$ (e.g., the voltage levels of "0" or "1" discussed above) results in a binary '0', while any voltage value received as return voltages 542 that is greater than or equal to $V_C$ (e.g., the voltage levels of "2" or "3" discussed above) results in a binary '1'. Thus, for example, where three cells of flash memory cells 540 return three voltage levels of "2, 2, 0", respectively, the corresponding binary output (i.e., binary values 552) is '110' (shown as values 433a, 433b). As another example, where three cells of flash memory cells 540 return three voltage levels of "3, 1, 2", respectively, the corresponding binary output is '101' (shown as values 433a, 433b). These binary values map to two soft data values corresponding to two LDPC codewords (i.e., low density parity check codeword 203 and low density parity check codeword 205). Said another way, the three bit binary values 433a, 433b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_C$ is performed to yield the soft data values corresponding to the next bits of the two LDPC codewords (i.e., low density parity check codeword 203 and low density parity check codeword 205). This process is repeated until soft data values corresponding to all bits of the LDPC codewords are generated (i.e., low density parity check codeword 203 and low density parity check codeword 205). Of note, a '111' pattern is an invalid value, but a soft data value is generated for it and all other valid patterns.

Of note, while not discussed herein, the same selection process between compaction and non-compaction can be used in relation to recovering the information in the second and third LDPC codewords. However, as the duplication shown in FIG. 4d is not as significant as that shown in FIG. 4b, the increase in transfer efficiency is not as great.

Turning to FIG. 4e, a third part of the aforementioned process of comparing return voltages 542 with threshold 556 is shown where the conversion of FIG. 4a was used in the original encoding. This third part recovers the fourth and fifth LDPC codewords (i.e., low density parity check codeword 207 and low density parity check codeword 209). As shown, a table 450 represents conversion of the three voltage levels 403a, 403b ({X, Y, Z}) of FIG. 4a where threshold 556 is the upper threshold ($V_U$). By comparing with $V_U$, any voltage value received as return voltages 542 that is less than $V_U$ (e.g., the voltage levels of "0" or "1" discussed above) results in a binary '0', while any voltage value received as return voltages 542 that is greater than or equal to $V_U$ (e.g., the voltage levels of "2" or "3" discussed above) results in a binary '1'. Thus, for example, where three cells of flash memory cells 540 return three voltage levels of "2, 2, 0", respectively, the corresponding binary output (i.e., binary values 552) is '000' (shown as values 453a, 453b). As another example, where three cells of flash memory cells 540 return three voltage levels of "3, 1, 2", respectively, the corresponding binary output is '100' (shown as values 453a, 453b). These binary values map to two soft data values corresponding to two LDPC codewords (i.e., low density parity check codeword 203 and low density parity check codeword 205). Said another way, the three bit binary values 453a, 453b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_U$ is performed to yield the soft data values corresponding to the next bits of the two LDPC codewords (i.e., low density parity check codeword 207 and low density parity check codeword 209). This process is repeated until soft data values corresponding to all bits of the LDPC codewords are generated (i.e., low density parity check codeword 207 and low density parity check codeword 209). Of note, a '111' pattern is an invalid value, but a soft data value is generated for it and all other valid patterns.

Of note, while not discussed herein, the same selection process between compaction and non-compaction can be used in relation to recovering the information in the fourth and fifth LDPC codewords. However, as the duplication shown in FIG. 4e is not as significant as that shown in FIG. 4b, the increase in transfer efficiency is not as great.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent—albeit such a system entirely implemented in software or firmware would not be a circuit. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for accessing a flash memory device, the system comprising:
    a data read circuit operable to compare voltages read from a set of M groups of N flash memory cells with a first threshold value to yield a binary output set, wherein the binary output set includes a set of M groups of N binary values, and wherein M and N are integers;
    a compaction based partial decoder circuit operable to compact a subset of the M groups of N binary values to yield a compacted output, wherein the compacted output is represented in fewer bits than a number of bits used to represent the subset of the M groups of N binary values; and
    a first data decoding circuit operable to generate at least one soft data value based upon the compacted output, wherein the soft data value corresponds to an element of a given codeword represented by the M groups of N binary values.

2. The system of claim 1, wherein the subset of the M groups of N binary values is a first subset of the M groups of N binary values, wherein the compacted output is a first compacted output, and wherein the compaction based partial decoder circuit is further operable to:
    repeatedly compact additional subsets of the M groups of N binary values to yield corresponding additional compacted outputs; and wherein the first decoder circuit is further operable to generate at least one additional soft data value based upon each of the respective additional compacted outputs.

3. The system of claim 2, the system further comprising:
a second data decoding circuit operable to apply a data decoding algorithm to the given codeword to yield a decoded output.

4. The system of claim 3, wherein the given codeword is a low density parity check codeword, and wherein the second data decoding circuit is a low density parity check decoding circuit.

5. The system of claim 1, wherein N is three, wherein the subset of the M groups of N binary values is one group of the N binary values, and wherein the compacted output is a ternary number represented by two bits.

6. The system of claim 1, wherein N is three, wherein the subset of the M groups of N binary values is three groups of the N binary values, and wherein the compacted output is a ternary number represented by five bits.

7. The system of claim 1, wherein N is three, wherein the subset of the M groups of N binary values is five groups of the N binary values, and wherein the compacted output is ternary number represented by eight bits.

8. The system of claim 1, wherein the given codeword is a first codeword, wherein the at least one soft data value is a first soft data value, wherein the binary output set is a first binary output set; wherein the data read circuit is further operable to compare voltages read from the set of M groups of N flash memory cells with a second threshold value to yield a second binary output set; and wherein the first data decoding circuit is further operable to:
generate at least a second soft data value directly from the second binary output set, wherein the second soft data value corresponds to an element of a second codeword represented by the M groups of N binary values.

9. The system of claim 8, wherein the first data decoding circuit comprises:
a first look-up table including soft data values corresponding to respective values of the compacted output; and
a second look-up table including soft data values corresponding to respective values of the N binary values.

10. The system of claim 1, wherein the set of M groups of N binary values is a first set of M groups of N binary values, wherein the given codeword is a first codeword, wherein the at least one soft data value is a first soft data value, wherein the binary output set is a first binary output set; wherein the data read circuit is further operable to compare voltages read from the set of M groups of N flash memory cells with a second threshold value to yield a second binary output set, and wherein the compaction based partial decoder circuit is further operable to:
compact a subset of a second set of M groups of N binary values to yield a second compacted output, wherein the second compacted output is represented in fewer bits than a number of bits used to represent the subset of the second set of M groups of N binary values; and
wherein the first data decoding circuit is further operable to:
generate at least a second soft data value directly from the second binary output set, wherein the second soft data value corresponds to an element of a second codeword represented by the M groups of N binary values.

11. The system of claim 10, wherein the first data decoding circuit comprises:

a first look-up table including soft data values corresponding to respective values of the first compacted output; and
a second look-up table including soft data values corresponding to respective values of the first compacted output.

12. The system of claim 1, wherein M is the number of elements in the given codeword.

13. The system of claim 1, wherein the system is implemented as part of an integrated circuit.

14. A method for accessing data from a flash memory device, the method comprising:
accessing a set of M groups of N flash memory cells to yield M groups of N voltages, and wherein M and N are integers;
using a read circuit to compare the M groups of N voltages with a first threshold value to yield a binary output set, wherein the binary output set includes a set of M groups of N binary values;
compacting a subset of the M groups of N binary values to yield a compacted output, wherein the compacted output is represented in fewer bits a number of bits used to represent the subset of the M groups of N binary values; and
generating at least one soft data value based upon the compacted output, wherein the soft data value corresponds to an element of a given codeword represented by the M groups of N binary values.

15. The method of claim 14, wherein N is three, wherein the subset of the M groups of N binary values is one group of the N binary values, and wherein the compacted output is a ternary number represented by two bits.

16. The method of claim 14, wherein N is three, wherein the subset of the M groups of N binary values is three groups of the N binary values, and wherein the compacted output is a ternary number represented by five bits.

17. The method of claim 14, wherein N is three, wherein the subset of the M groups of N binary values is five groups of the N binary values, and wherein the compacted output is ternary number represented by eight bits.

18. The method of claim 14, wherein the subset of the M groups of N binary values is a first subset of the M groups of N binary values, wherein the compacted output is a first compacted output, and wherein the method further comprises:
repeatedly compacting additional subsets of the M groups of N binary values to yield corresponding additional compacted outputs;
generating at least one additional soft data value based upon each of the respective additional compacted outputs; and
applying a data decoding algorithm to the given codeword to yield a decoded output.

19. A flash memory system, the system comprising:
a set of M groups of N flash memory cells;
a write circuit operable to encode a data input to a M groups of N voltages, and to program the M groups of N flash memory cells with the M groups of N voltages;
a data read circuit operable to compare voltages read from the set of M groups of N flash memory cells with a first threshold value to yield a binary output set, wherein the binary output set includes a set of M groups of N binary values, and wherein M and N are integers;
a compaction based partial decoder circuit operable to compact a subset of the M groups of N binary values to yield a compacted output, wherein the compacted output is represented in fewer bits than a number of bits used to represent the subset of the M groups of N binary values; and a first data decoding circuit operable to generate at least one soft data value based upon the compacted output, wherein the soft data value corresponds to an element of a given codeword represented by the M groups of N binary values.

20. The flash memory system of claim 19, wherein the subset of the M groups of N binary values is a first subset of the M groups of N binary values, wherein the compacted output is a first compacted output, and wherein the compaction based partial decoder circuit is further operable to:

repeatedly compact additional subsets of the M groups of N binary values to yield corresponding additional compacted outputs;

wherein the first decoder circuit is further operable to generate at least one additional soft data value based upon each of the respective additional compacted outputs; and wherein the system further includes a second data decoding circuit operable to apply a data decoding algorithm to the given codeword to yield a decoded output.

* * * * *